(12) United States Patent
Cheruvu et al.

(10) Patent No.: US 9,511,572 B2
(45) Date of Patent: Dec. 6, 2016

(54) NANOCRYSTALLINE INTERLAYER COATING FOR INCREASING SERVICE LIFE OF THERMAL BARRIER COATING ON HIGH TEMPERATURE COMPONENTS

(75) Inventors: Narayana Sastry Cheruvu, San Antonio, TX (US); Ronghua Wei, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 256 days.

(21) Appl. No.: 13/463,948

(22) Filed: May 4, 2012

(65) Prior Publication Data

US 2013/0122317 A1 May 16, 2013

Related U.S. Application Data

(60) Provisional application No. 61/489,864, filed on May 25, 2011.

(51) Int. Cl.
*B32B 15/04* (2006.01)
*B32B 33/00* (2006.01)
(Continued)

(52) U.S. Cl.
CPC .............. *B32B 33/00* (2013.01); *B32B 15/04* (2013.01); *C22C 19/00* (2013.01); *C22C 19/03* (2013.01);
(Continued)

(58) Field of Classification Search
CPC ....... B32B 15/04; B32B 15/18; B32B 15/20; B32B 33/00; B32B 2605/18; B32B 2571/02; C23C 14/165; C23C 28/3455; C23C 28/345; C23C 28/3215; C23C 4/04; C23C 4/085; C23C 28/022; C23C 28/00; C23C 30/00; C23C 30/005; Y10T 428/12937; Y10T 428/12944; Y10T 428/12931; C22C 19/00; C22C 19/03; C22C 19/05; C22C 19/07
See application file for complete search history.

(56) References Cited

U.S. PATENT DOCUMENTS

| 4,275,124 A | 6/1981 | McComas et al. |
| 4,321,311 A | 3/1982 | Strangman |

(Continued)

FOREIGN PATENT DOCUMENTS

| JP | 2000326108 A | 11/2000 |
| WO | WO 2009/065545 A1 | 5/2009 |

OTHER PUBLICATIONS

Cheruvu, N.S., et al.; "Effect of Time and Temperature on Thermal Barrier Coating Failure Mode Under Oxidizing Environment"; Journal of Eng. for Gas Turbines and Power; Mar. 2009; pp. 022101-1 through 022101-7; vol. 131.
(Continued)

*Primary Examiner* — Michael E La Villa
(74) *Attorney, Agent, or Firm* — Grossman, Tucker et al.

(57) ABSTRACT

A coated substrate including a substrate having a surface, a bond coat proximate to the substrate surface, a yttrium stabilized zirconia (YSZ) thermal barrier layer opposite the substrate surface, and at least one interlayer disposed between the bond coat and the thermal barrier layer, wherein the interlayer contains an alloy having a nanocrystalline grain structure. A method for coating a substrate to be exposed to high in service temperatures and/or temperature cycles including depositing a bond coating on substrate surface, depositing at least one nanocrystalline interlayer on the bond coat opposite the substrate surface, and depositing a yttrium stabilized zirconia (YSZ) thermal barrier coating on the nanocrystalline interlayer opposite the bond coat, wherein the service life of the YSZ thermal barrier coating is extended relative to a substrate coated with the bond coating and the thermal barrier without the interlayer disposed therebetween.

6 Claims, 8 Drawing Sheets

(51) Int. Cl.

| | | |
|---|---|---|
| *C23C 28/02* | (2006.01) | |
| *C23C 30/00* | (2006.01) | |
| *C23C 28/00* | (2006.01) | |
| *C22C 19/03* | (2006.01) | |
| *C22C 19/00* | (2006.01) | |
| *F01D 5/28* | (2006.01) | |
| *C22C 19/05* | (2006.01) | |
| *C22C 19/07* | (2006.01) | |
| *C23C 14/16* | (2006.01) | |

(52) U.S. Cl.
CPC .............. *C22C 19/05* (2013.01); *C22C 19/07* (2013.01); *C23C 14/165* (2013.01); *C23C 28/00* (2013.01); *C23C 28/022* (2013.01); *C23C 28/3215* (2013.01); *C23C 28/345* (2013.01); *C23C 28/3455* (2013.01); *C23C 30/00* (2013.01); *C23C 30/005* (2013.01); *F01D 5/28* (2013.01); *F01D 5/288* (2013.01); *Y10T 428/12931* (2015.01); *Y10T 428/12937* (2015.01); *Y10T 428/12944* (2015.01)

(56) References Cited

U.S. PATENT DOCUMENTS

| | | |
|---|---|---|
| 4,419,416 A | 12/1983 | Gupta et al. |
| 4,585,481 A | 4/1986 | Gupta et al. |
| 4,588,490 A | 5/1986 | Cuomo et al. |
| 5,053,245 A | 10/1991 | Kiyama et al. |
| 5,077,140 A | 12/1991 | Luthra et al. |
| 5,122,252 A | 6/1992 | Latz et al. |
| 5,178,739 A | 1/1993 | Barnes et al. |
| 5,308,806 A | 5/1994 | Maloney et al. |
| 5,309,874 A | 5/1994 | Willermet et al. |
| 5,346,600 A | 9/1994 | Nieh et al. |
| 5,499,905 A | 3/1996 | Schmitz et al. |
| 5,683,825 A | 11/1997 | Bruce et al. |
| 5,824,198 A | 10/1998 | Williams et al. |
| 5,858,471 A | 1/1999 | Ray et al. |
| 5,948,215 A | 9/1999 | Lantsman |
| 6,054,188 A | 4/2000 | Tropsha et al. |
| 6,060,174 A | 5/2000 | Sabol et al. |
| 6,087,025 A | 7/2000 | Dearnaley et al. |
| 6,129,991 A | 10/2000 | Warnes et al. |
| 6,255,007 B1 | 7/2001 | dos Santos Pereira Ribeiro |
| 6,444,036 B2 | 9/2002 | Chern et al. |
| 6,455,167 B1* | 9/2002 | Rigney ................... C23C 28/00 416/241 R |
| 6,500,742 B1 | 12/2002 | Chern et al. |
| 6,504,151 B1 | 1/2003 | Mitchell et al. |
| 6,548,161 B1 | 4/2003 | Torigoe et al. |
| 6,585,870 B1 | 7/2003 | Pitcher et al. |
| 6,599,399 B2 | 7/2003 | Xu et al. |
| 6,699,530 B2 | 3/2004 | Danek et al. |
| 6,733,907 B2 | 5/2004 | Morrison et al. |
| 6,767,436 B2 | 7/2004 | Wei |
| 6,896,773 B2 | 5/2005 | Chistyakov |
| 6,896,775 B2 | 5/2005 | Chistyakov |
| 6,923,885 B2 | 8/2005 | Masuda et al. |
| 6,933,052 B2 | 8/2005 | Gorman et al. |
| 7,067,002 B2 | 6/2006 | Schmidt et al. |
| 7,128,980 B2 | 10/2006 | Schedler et al. |
| 7,258,912 B2 | 8/2007 | Yamamoto et al. |
| 7,311,940 B2 | 12/2007 | Nagaraj et al. |
| 7,361,386 B2 | 4/2008 | Kim et al. |
| 7,491,431 B2 | 2/2009 | Chiruvolu et al. |
| 8,790,791 B2 | 7/2014 | Cheruvu |
| 9,279,187 B2 | 3/2016 | Wei et al. |
| 2001/0025205 A1 | 9/2001 | Chern et al. |
| 2002/0001976 A1 | 1/2002 | Danek et al. |
| 2002/0032073 A1 | 3/2002 | Rogers et al. |
| 2002/0132132 A1 | 9/2002 | Bose et al. |
| 2002/0197502 A1 | 12/2002 | Zhao et al. |
| 2003/0211736 A1 | 11/2003 | Ludviksson |
| 2004/0055870 A1 | 3/2004 | Wei |
| 2004/0099215 A1 | 5/2004 | Danek et al. |
| 2004/0131865 A1* | 7/2004 | Kim et al. ................ 428/433 |
| 2004/0144318 A1 | 7/2004 | Beck et al. |
| 2004/0244653 A1 | 12/2004 | Schmidt et al. |
| 2004/0259366 A1 | 12/2004 | Kim et al. |
| 2005/0011748 A1 | 1/2005 | Beck et al. |
| 2005/0079368 A1 | 4/2005 | Gorman |
| 2005/0170162 A1 | 8/2005 | Yamamoto et al. |
| 2006/0147728 A1 | 7/2006 | Shen et al. |
| 2006/0166019 A1 | 7/2006 | Spitsberg et al. |
| 2007/0087185 A1 | 4/2007 | Wei et al. |
| 2007/0228664 A1 | 10/2007 | Anand et al. |
| 2007/0284255 A1 | 12/2007 | Gorokhovsky et al. |
| 2009/0214787 A1 | 8/2009 | Wei et al. |
| 2010/0009144 A1 | 1/2010 | Schumann et al. |
| 2010/0068556 A1 | 3/2010 | Lemmon et al. |
| 2010/0104859 A1 | 4/2010 | Berczik et al. |
| 2010/0297409 A1 | 11/2010 | Subramanian |
| 2010/0297410 A1 | 11/2010 | Subramanian |
| 2011/0111190 A1 | 5/2011 | Wei et al. |
| 2011/0256417 A1 | 10/2011 | Cheruvu |
| 2012/0114960 A1 | 5/2012 | Takesawa et al. |

OTHER PUBLICATIONS

Cheruvu, N. Sastry, et al; "Oxidation Behavior of Sputter Deposited Nanocrystalline and Conventional Plasma Sprayed MCrAl(Y) Coatings"; Proceedings of ASME Turbo Expo 2010: Power for Land, Sea, & Air; Jun. 14-18, 2010; Paper # GT2010-22645; pp. 1-8; Glasgow, UK.

Chan, K.S., et al "Degradation Mechanism Characterization and Remaining Life Prediction for NiCoCrAlY Coatings"; Proceedings of ASME Turbo Expo 2004, Power for Land, Sea and Air, Jun. 14-17, 2004, Vienna, Austria, Paper GT2004-53383, pp. 775-782.

Chan, K.S., et al "Development of a Thermal Barrier Coating Life Model"; Proceedings of ASME Turbo Expo 2003, Power for Land, Sea & Air, Jun. 16-19, 2003, Atlanta Georgia. Paper GT2003-38171, pp. 591-595.

Chen, G.F., et al, "Oxidation Behavior of Sputtered Ni—3Cr—20Al Nanocrystalline Coating", Materials Science & Engineering, vol. A271, pp. 360-365, 1999.

Chen, G.F., et al "The Mechanism of Oxidation of Sputtered Ni—Cr—Al Nanocrystalline Coatings", Corrosion Reviews, vol. 18, Issue 2-3, pp. 195-204, 2000.

Cheruvu, N.S., et al "Cyclic Oxidation Behavior and Microstructure of Nanocrystalline Ni—20Cr—4Al Coating"; 2010, Oxidation of Metals, 73, pp. 493-511.

Cheruvu, N.S., et al "Effect of Time and Temperature on Thermal Barrier Coating Failure Mode Under Oxidizing Environment", Journal of Engineering for Gas Turbines and Power; Mar. 2009, vol. 131. (7 pp.); downloaded Apr. 23, 2015 from: <<http://gasturbinespower.asmedigitalcollection.asme.org>>.

Cheruvu, N.S., et al "Oxidation Behavior of Sputter Deposited Nanocrystalline and Conventional Plasma Sprayed MCrAl(Y) Coatings", Proceedings of ASME Turbo Expo 2010: Power for Land, Sea and Air, Jun. 14-18, 2010, Glasgow, UK, Paper GT2010-22645, pp. 1-8, downloaded Apr. 23, 2015 from: <<http://proceedings.asmedigitalcollection.asme.org>>.

Gao, W., et al "Nano- and Microcrystal Coatings and Their High Temperature Applications"; Advanced Materials, 2001, vol. 13,, No. 12-13, pp. 1001-1004.

Geng, S., et al "Hot-Corrosion Resistance of a Sputtered K38G Nanocrystalline Coating in Molten Sulfate at 900° C."; Oxidation of Metals, Jun. 200, vol. 57, Nos. 5/6, pp. 549-557, (Jun. 2002).

Hillery, R.V., et al, NASA Contractor Report 180807, Nov. 1988, "Thermal Barrier Coating Life Prediction Model Development", Final Report, R87AEB586 (155 pgs).

Jordan, E. et al, project 20-01-SR097; UCONN, "Measurement of Three Critical Parameters as a Basis for a Simple Life Prediction Method"; pp. 37-57; Presented at Material Workshop III, The High Efficiency Engines and Turbines, University Turbine Systems Research (HEET-UTSR), Program Storrs, CT., Oct. 14-16, 2002.

(56) References Cited

OTHER PUBLICATIONS

Lau, H., et al, "Influence of Bondcoat Pre-Treatment and Surface Topology on the Lifetime of EB-PVD TBCs"; Surface & Coatings Technology 165, 2003, pp. 217-223.

Leyens, C., et al, "Influence of Electron Beam Physical Vapor Deposited Thermal Barrier Coating Microstructure on Thermal Barrier Coating System Performance Under Cyclic Oxidation Conditions"; Surface & Coating Technology, 120-121, 1999, pp. 68-76.

Liu, Z., et al "Cyclic Oxidation of Sputter Deposited Nanocrystalline Fe—Cr—Ni—Al Alloy Coatings"; 1999 Oxidation of Metals, vol. 51. Nos. 5/6, pp. 403-419.

Liu, Z., et al "Improved Oxide Spallation Resistance of Microcrystalline Ni—Cr—Al Coatings"; 1998 Oxidation of Metals, vol. 50,, Nos. 112, pp. 51-69.

Liu, Z., et al "Oxidation Behaviour of Nanocrystalline Fe—Ni—Cr—Al Alloy Coatings", Dec. 1999, Materials Science and Technology, vol. 15,, pp. 1447-1450.

Liu, Z., et al "Oxidation Behaviour of Sputter-Deposited Ni—Cr—Al Micro-crystalline Coatings"; Acta Materialia, 1998 vol. 46, No. 5, pp. 1691-1700.

Liu, Z., et al "The Effect of Coating Grain Size on the Selective Oxidation Behaviour of Ni—Cr—Al Alloy"; 1997 Scripta Materialia, vol. 37, No. 10, pp. 1551-1558.

Stiger, M.J., et al, "Thermal Barrier Coatings for the 21st Century", Journal Title Zeitschrift fuer Metalkunde, vol. 90, 1999, pp. 1069-1078.

Tolpygo, V. K., et al "Oxidation-induced Failure of EB-PVD Thermal Barrier Coatings"; Surface & Coatings Technology, 146-147, 2001, pp. 124-131.

Vaidyanathan, K., et al "Mechanisms of Spallation of Electron Beam Physical Vapor Deposited Thermal Barrier Coatings With and Without Platinum Aluminide Bond Coat Ridges"; Surface & Coatings Technology, 133-134, 2000, pp. 28-34.

Wang, F., "The Effect of Nanocrystallization on the Slective Oxidation and Adhesion of Al2O3 Scales"; 1997 Oxidation of Matels, vol. 48, Nos. 3/4 pp. 215-224.

Wang, F., et al "The Mechanism of Scale Adhesion on Sputtered Microcrystallized CoCrAl Films"; 1996 Oxidation of Metals, vol. 45, Nos. 1/2, pp. 39-50.

Wei, R., et al "Deposition of Thick Nitrides and Carbonitrides for Sand Erosion Protection"; Surface and Coatings Technology, vol. 201, 2006, pp. 4453-4459.

Wei, R., "Plasma Enhanced Magnetron Sputter (PEMS) Deposition of Thick Nanocomposite Coatings for Erosion Protection"; 2008, in Nanocomposite Coatings and Nanocomposite Materials, vol. 54-55, 2008, pp. 240-269.

Wei, R., "Plasma Enhanced Magnetron Sputter Deposition of Ti—Si—C—N Based Nanocomposite Coatings"; Surface & Coatings Technology, vol. 203, 2008, pp. 538-544.

Wei, R., "Plasma Enhanced Magnetron Sputtering Deposition of Superhard, Nanocomposite Coatings"; 2008 in Plasma Surface Engineering Research and its Practical Applications, pp. 87-111, editor R. Wei, Research Signpost, Kerala, India.

Wei, R., et al "Solid Particle Erosion Protection of Turbine Blades with Thick Nitride and Carbonitride Coatings from Magnetron Sputter Deposition"; Surface Engineering Proceedings of the 5th International Surface Engineering Congress, May 15-17, 2006, Wathington State Convention Ctr, Seattle, Washington, ASM International, pp. 78-84.

Wright, I.G., et al "Influence of Aluminum Depletion Effects on the Calculation of the Oxidation Lifetimes of FeCrAl Alloys"; Materials Science Forum, vols. 461-464, (2004), pp. 579-590; Trans Tech Publications, Inc., Stafa-Zurich, Switzerland.

Zhang, C., et al "Hot Corrosion of an Electrodeposited Ni-11 wt% Cr Nanocomposite Under Molten Na2SO4—K2SO4—NaCl", Journal of the Electrochemical Society, 2005, vol. 152, pp. B321-B326.

Anton et al., Thermal Cycling Testing of Thermal Barrier Coatings, Cyclic Oxidation of High Temperature Materials, Chapter 21, 1999, pp. 339-356.

ASTM International, "Standard Test Method for Conducting Erosion Tests by Solid Particle Impingement Using Gas Jets," Designation G76-07 (6 pgs), (Sep. 2010).

Cheruvu et al., Evaluation, degradation and life assessment of coatings for land based combustion turbines, Energy Materials, 2006, pp. 33-47, vol. 1.

Cheruvu et al., Evaluation of Nanocrystalline Coatings for Coal-Fired Ultra-Supercritical Boiler Tubes, Proceedings of the ASME 2009 Pressure Vessels and Piping Division Conference, Jul. 26-30, 2009, pp. 1-10, PVP2009-77092, Prague, Czech Republic.

Cheruvu et al., In-service Degradation and Life Prediction of Coatings for Advanced Land-based Gas Turbine Buckets*, JSME International Journal, 2003, pp. 635-641, Series A, vol. 46, No. 4.

Cheruvu et al., Microstructure and oxidation resistance of nanocrystalline 304 SS—Al coatings, Surface & Coatings Technology, 2009, pp. 751-755, vol. 204.

Ding et al., Mechanical properties and wear resistance of multilayer thin coatings on cutting tools, Journal of Tribology, vol. 20, No.3, pp. 170-174 Jun. 30, 2000.

Diserens, et al "Improving the Properties of Titanium Nitride by Incorporation of Silicon"; Surface and Coatings Technology, Elsevier, Amsterdam, N, vol. 108-109; No. 1-3, Apr. 27, 1998, pp. 241-246.

Garwin et al., TiN High Temperature Diffusion Barrier for Copper-Gasketed Stainless-Steel Flanges, Journal of Vacuum Science and Technology, Stanford Linear Accelerator Center, Mar. 1986, pp. 1-4, Pub 3907, Stanford University, Stanford, California.

Harvey, What is an MCrAlY coating?, http://www.twi.co.uk/content/faqmdfh005.html, downloaded from internet Mar. 24, 2010, 2 pages.

Hass, Thermal Barrier Coatings, Chapter 2, Directed Vapor Deposition of Thermal Barrier Coatings, 2000, Ph.D. Dissertation, University of Virginia, pp. 6-20.

HAYNES® 188 Alloy, Haynes International High-Temperature Alloys, downloaded from Internet Nov. 2009, 16 pages.

HAYNES® 230® Alloy, Haynes International High-Temperature Alloys, downloaded from Internet Nov. 2009, 28 pages.

HAYNES® HR-120® alloy, Haynes International High-Temperature Alloys, downloaded from Internet Nov. 2009, 28 pages.

HAYNES® HR-160® alloy, Haynes International High-Temperature Alloys, downloaded from Internet Nov. 2009, 24 pages.

Jbaker.Com, "Hexamethyldisilozane," available at www.jbaker.com/msds/englishhtml/h2066.htm; retrieved on Feb. 5, 2009. 5 pages.

J.E. Krzanowski, et al "Mechanical Properties of Sputter-Deposited Titanium-Silicon-Carbon Films"; Journal of the American Ceramic Society, Mar. 2001, vol. 84, No. 3, pp. 672-674.

Lin et al., Oxidation behavior and AlN films at high temperature under controlled atmosphere—Abstract, Department of Materials Science and Engineering, Nov. 1, 2007, 2 pages.

Merceron et al., Long Term Oxidation of FeCrAl ODS Alloys at High Temperature, Materials Science Forum, 2001, pp. 269-276, vols. 369-372.

Miller, Current Status of Thermal Barrier Coatings—An Overview*, Surface and Coatings Technology, 1987, pp. 1-11, 30.

Movchan et al., Two- and three-layer coatings produced by deposition in vacuum for gas turbine blade protection, Surface and Coatings Technology, 1994, pp. 55-63, 67.

Niederhoferet et al. Surface and Coating Technology, 120-121, 1999, 173-178.

Oliver, et al., "An improved technique for determining hardness and elastic modulus using load and displacement sensing indentation experiments," J. Mater. Res., vol. 7, No. 6, Jun. 1992, pp. 1564-1583.

Östling et al., A Comparative Study of the Diffusion Barrier Properties of TiN and ZrN, Elsevier Sequoia, Thin Solid Films, Metallurgical and Protective Coatings, 1986, pp. 81-88, vol. 145.

Padture et al., Thermal Barrier Coatings for Gas-Turbine Engine Applications, Science—Science's Compass—Review, Apr. 12, 2002, pp. 280-284, vol. 296.

(56) References Cited

OTHER PUBLICATIONS

Poire, "Micro Photonics Inc.," Analytical Report NHT-020802, Method: Nano Hardness Tester. Sample(s) Optical Fiber w/connector. Customer: Megladon Manufacturing Gp., Date: Aug. 2, 2002. 8 pages.

Science lab.com, "Material Safety Data Sheet, Hexamethyldisiloxane MSDS," available at http://www.sciencelab.com/xMSDS-Hexamethyldisiloxane-9924249, retrieved on May 1, 2009. 6 pages.

Seal, "Transition Metal Nitride Functional Coatings," JOM; Functional Coatings Overview. Dated: Sep. 2001. 1 page.

Shin et al., Diffusion barrier property of TiN and TiN/Al/TiN films deposited with FMCVD for Cu interconnection in VLSI, Science and Technology of Advanced Materials, 2004, pp. 399-405, vol. 5.

Stainless Steel—Grade 304, AZomaterials, downloaded from the interned Aug. 11, 2009, 4 pages.

Stiger et al., Mechanisms for the Failure of Electron Beam Physical Vapor Deposited Thermal Barrier Coatings Induced by High Temperature Oxidation, Elevated Temperature Coatings: Science and Technology III,The Minerals, Metals & Materials Society, 1999, pp. 51-65.

Swann, "Magnetron Sputtering," Phys. Technol. 19. Dated 1988. 9 pages. IOP Publishing Ltd. Printed in the UK.

Uusitalo et al., High temperature corrosion of coatings and boiler steels in reducing chlorine-containing atmosphere, Surface and Coatings Technology, 2002, pp. 275-285, 161.

Vacuum Turbine Blade Coating—Electron Beam / Physical Vapor Deposition (EB/PVD) of Protective MCrAlY) and Thermal Barrier Coatings (TBC) The Solution ALD, http://web.ald-vt.de/cms/vakuum-technologie/anlagen/edpve/, Downloaded from interned Mar. 24, 2010, 3 pages.

Wang et al., High temperature stability of Zr—Si—N diffusion barrier in Cu/Si contact system, Microelectronic Engineering, 2004, pp. 69-75, vol. 71.

Wei, et al., "Effect of Deposition Parameters on MCrAl Coating Properties Using Dual Magnetron Sputter Deposition," Presented at the 53rd SVC Technical Conference in Orlando, FL, in the Heurekal session on Apr. 19, 2010, published in SVC Bulletin, 2011 Spring Bulletin, pp. 30-38.

Xiao et al, "Plasma-enhanced Deposition of Hard Silicon Nitride-like Coatings From Hexamethyldisiloxane and Ammonia"; Elsevier Science B.V., Surface and Coatings Technology 172, 2003 (pp. 184-188).

Yamashita et al., Oxidation Behavior of Aluminum Nitride Thin Films on Superalloy Substrates, Journal of the Ceramic Society of Japan, 2004, pp. S946-S949, Supplement 112-1.

\* cited by examiner (a) After 1003 cycles exposure  (b) After 2010 cycles exposure

NANOCRYSTALLINE INTERLAYER COATING FOR INCREASING SERVICE LIFE OF THERMAL BARRIER COATING ON HIGH TEMPERATURE COMPONENTS

This Application claims the benefit of the filing date, pursuant to 35 U.S.C. §119(e), of U.S. Provisional Application for Patent Ser. No. 61/489,864, filed May 25, 2011, which is incorporated herein by reference.

The disclosed method and resulting coated substrate substantially increase the service life of thermal barrier coatings applied on high temperature components, such as gas turbine blades and other hot section components, through the application of a nanocrystalline interlayer coating over conventional oxidation- and/or corrosion-resistant bond coat(s).

Advanced turbine systems, such as gas turbines, are used in the electrical power generation utility industry and the aerospace industry. A gas turbine is a heat engine that uses a high-temperature, high pressure gas as the working fluid. Combustion of a fuel in air is usually used to produce the needed temperatures and pressures in the turbine, such that gas turbines are often referred to as "combustion" turbines. To capture the energy, the working fluid is directed tangentially by vanes at the base of combustor nozzles to impinge upon specially designed airfoils, that is, the turbine blades. The turbine blades, through their curved shapes, redirect the gas stream, which absorbs the tangential momentum of the gas and produces the power. A series of turbine blade rows, or stages, are attached to a rotor/shaft assembly. The shaft rotation drives an electric generator and a compressor for the air used in the gas turbine combustor for electrical power generation. Aero engines harness power from the turbine engine in various ways, depending upon the type.

The path to higher gas turbine efficiency includes higher working fluid temperatures. However, increasing operating temperatures above conventional temperatures of 2,350° F. up to the 2,800° F. threshold of thermal NOx formation provides a significant challenge to the turbine structural materials. Despite improvements in cooling and the structural metal alloys, thermal barrier coatings (TBCs) are utilized to provide insulation and protection of the metal substrate from combustion gases. A ceramic TBC topcoat provides thermal resistance, and a metal bond coat provides oxidation resistance and bonds the TBC topcoat to the substrate.

Modified oxidation- and corrosion-resistant bond coatings, such as MCrAlY or Pt—Al coatings, and thermal barrier coatings, such as yttria stabilized zirconia (YSZ), have been developed and introduced in natural gas fired G and H class turbines. In these advanced turbine designs, YSZ coatings are used as a prime reliant coating. The new G and H technologies have been applied to older D, E and F class turbines to increase their performance and extend the service life of the hot section components. The use of YSZ on the hot section components can improve the gas turbine efficiency through the reduction of cooling airflow. However, the risk involved in reducing the cooling airflow requires a highly reliable YSZ.

YSZs comprise low thermal conductivity ceramic oxides. A widely used YSZ in the industry is made of yttria stabilized zirconia, YSZ (8% $Y_2O_3$—$ZrO_2$). The YSZ is normally deposited using either an air plasma spray (APS) or electron beam physical vapor deposition (EB-PVD) process over an oxidation and corrosion resistant MCrAlY, aluminide or modified aluminide, such as Pt-aluminide or Rh-aluminide, bond coated surface. The MCrAlY alloy, wherein M represents at least one of Ni, Co, or Fe, is widely used as a bond coat for land based turbine applications, and is conventionally deposited using a low pressure plasma spray (LPPS), vacuum plasma spray (VPS) or high velocity oxy flame (HVOF) thermal spray process. The bond coat provides oxidation/corrosion protection for the hot section components by supplying aluminum for the in-service formation of a stable $Al_2O_3$ scale at the outer surface of the coating.

The microstructure of a service-exposed YSZ coated hot section component exhibits four different layers, as schematically shown in FIG. 1. These layers are i) YSZ, ii) a thermally grown oxide (TGO) between the bond coat and the YSZ, iii) the bond coat, and iv) the metal alloy substrate. The hot section components are made of nickel or cobalt based metal alloys. The TGO that forms during service on the McrAlY or Pt-aluminide bond coats is alumina ($Al_2O_3$). Long-term exposure and high operating temperatures promote formation of NiO, $Cr_2O_3$ and spinels, along with $Al_2O_3$. The presence of mixed oxides may accelerate the spallation of YSZ. As the $Al_2O_3$ scale grows during service, cracks may form within the YSZ and/or along the TGO/YSZ interface. The primary failure mode of YSZs is spallation of the top YSZ ceramic layer, which may occur during a turbine engine shut down event. Land based gas turbines and aero engines operate in a frequent on-off mode. As a result, the turbine components experience thermal cycling between the (high) operating temperature and (low) room temperature, resulting in high thermal stress in the TGO, which may lead to cracking and spallation of YSZ.

The formation of TGO and the corresponding growth stresses at the YSZ/bond coat interface is one of the main causes for the YSZ spallation. The critical TGO thickness for the failure of the EB-PVD formed YSZ under thermal cycling conditions has been reported to be 4 to 8.5 μm. The critical oxide thickness criterion has been widely used for service life estimation and validation of YSZ life-time models. Reduction of the TGO growth kinetics may increase YSZ durability and service life.

In addition to the general failure mechanism due to the TGO growth, long-term test results have shown that the primary YSZ failure mechanism at relatively low temperatures, under typical land-base turbine operating conditions (with fewer start-stop cycles), is internal oxidation of the bond coat, as illustrated in FIG. 2 for 18,000 hours at 1850° F. The internal oxidation of the bond coat also promotes delamination of the bond coat.

A method is provided for coating a substrate to be exposed to high in-service temperatures and/or temperature cycles comprising:
  depositing a bond coating on substrate surface,
  depositing at least one nanocrystalline interlayer on the bond coat opposite the substrate surface, and
  depositing a yttrium stabilized zirconia (YSZ) thermal barrier coating on the nanocrystalline interlayer opposite the bond coat,
  wherein the service life of the YSZ thermal barrier coating is extended relative to a substrate coated with the bond coating and the thermal barrier without the interlayer disposed therebetween.

A coated substrate is provided, comprising a substrate having a surface, a bond coat proximate to the substrate surface, a yttrium stabilized zirconia (YSZ) thermal barrier layer opposite the substrate surface, and at least one interlayer disposed between the bond coat and the thermal barrier layer, wherein the interlayer comprises an alloy having a nanocrystalline grain structure.

The nanocrystalline interlayer may comprise an alloy of MCrAl, wherein M represents at least one transition metal. The nanocrystalline interlayer may comprises an alloy of MCrAlX, wherein M represents at least one transition metal and X represents at least one metal or metalloid. M may be at least one of Ni, Co, or Fe. X may be at least one of Hf, Si, or Y.

In certain embodiments, the nanocrystalline interlayer may comprise at least one of NiCrAl, NiCoCrAl, CoCrAl, or NiCoCrAlSiHf, with or without yttrium, optionally comprising 0 to about 0.5 weight % Y.

In certain embodiments, the grain size of the nanocrystalline interlayer is below about 250 nm, optionally below about 100 nm, as measured by X-ray diffraction.

In certain embodiments, the bond coat may comprise at least one of MCrAlY, aluminide. Pt-modified aluminide or Rh-modified aluminide.

The subject method is useful in preparing coated substrates or components such as nozzles, transitions, baskets, blade seals and transition tiles, in addition to blades and vanes, of both land-based and aero engines, and other high temperature operating environment components.

The nanocrystalline interlayer such as MCrAl(Y), may be deposited using methods such as physical vapor deposition (PVD) processes, including electron beam evaporation, cathodic arc deposition, magnetron sputter deposition, or CVD enhanced magnetron sputter deposition, and the like. The nanocrystalline interlayer, such as MCrAl or MCrAlX, may be deposited by other conventional deposition methods including but not limited to plasma spray (air plasma spray, (APS), low pressure plasma spray (LPPS), or vacuum plasma spray (VPS)), thermal spray, high velocity oxy flame (HVOF), or chemical vapor deposition (CVD) processes.

Figure 3:
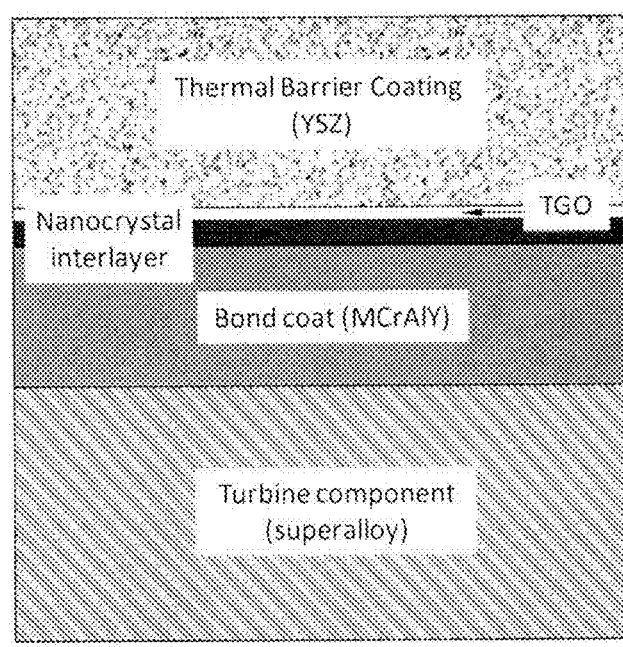
FIG. 3 is a schematic representation of the microstructure of a YSZ thermal barrier coating coated substrate with a nanocrystalline MCrAl(X) interlayer coating between a conventional bond coat and the YSZ, after formation of a high temperature service-induced thermally grown oxide.

We have found that applying a nanocrystalline MCrAl(Y) interlayer between a conventional bond coat on a high service temperature alloy component and a YSZ thermal barrier coating over the bond coat as schematically shown in FIG. 3, substantially slows down the thermally grown oxide (TGO) growth rate and delays the formation of non-$Al_2O_3$ oxides. By applying the nanocrystalline MCrAl(Y) interlayer coating between the conventional bond coat and the YSZ, the service life of the coated component can be significantly improved.

Figure 4:
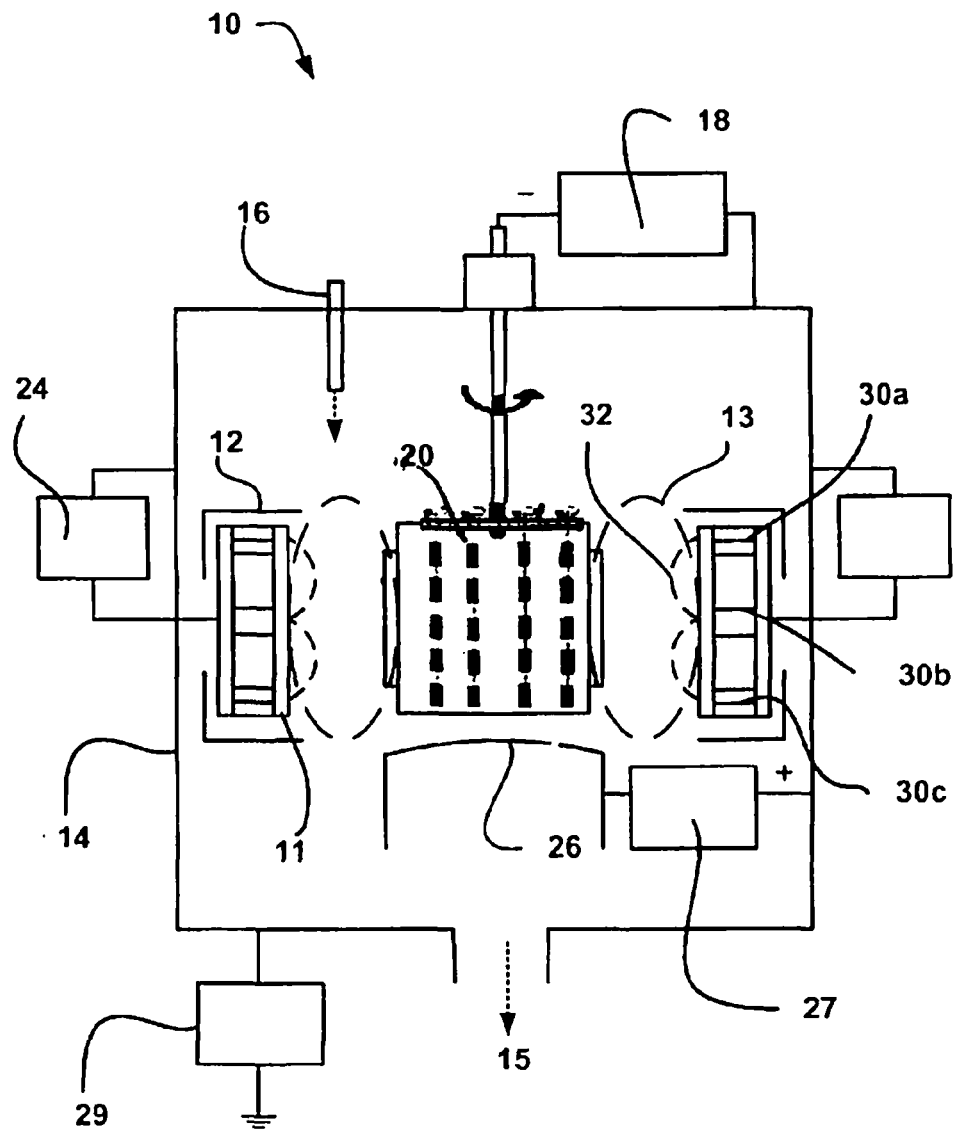
FIG. 4 is a schematic representation of a Plasma Enhanced Magnetron Sputter (PEMS) process apparatus that may be used for the nanocrystalline MCrAl(X) deposition.

By way of illustration but not limitation, a nanocrystalline MCrAl(Y) coating can be applied using a magnetron sputter deposition process on conventionally plasma-sprayed MCrAlY bond coated metal alloy components. In one embodiment, a plasma enhanced magnetron sputter (PEMS) process may be used for the nanocrystalline MCrAl(Y) deposition, an example of which is illustrated in FIG. 4 wherein a dual magnetron sputtering system may be utilized to produce the coating layer(s). The magnetron sputtering system 10 may include one or more magnetrons 12, each supporting a sputter material target 11 in a vacuum chamber 14 having a gas port 16 and one or more vacuum pumps 15 in fluid communication with the vacuum chamber 14. The gas port 16 may be supplied by precursor supply system, as well as by an inert gas feed, according to known methods. Inert gases may include argon, krypton, xenon, etc., and it may be appreciated that in some embodiments, the precursor gases may be carried by inert gas through the system.

The magnetron sputtering system may also include an electron source 26, such as a filament, which may discharge electrons into the system when heated to thermionic emission temperature. Examples of filaments may include tungsten or tantalum. Electron sources may also include, for example, hollow cathode(s), RF antenna(s) and microwave generator(s). The magnetron sputtering system 10 may provide an energy source 24 for negatively biasing the magnetron 12, an energy source 18 for negatively biasing the surface of the substrate workpieces or samples 20, and an energy source 27 for negatively biasing the electron source, as well as, in some embodiments, an energy source 29 for positively biasing the chamber wall 14. The energy source may be a voltage source and may be associated with circuitry. The energy sources may provide radio frequency (RF) or native voltage in the form of DC power or pulse DC power. Where DC power or pulse DC power may be contemplated, a voltage control may be activated to negatively bias the respective component.

The magnetron 12 may assume any structure or geometry that may be effective to produce a substantially uniform magnetron generated plasma 13 along the length L-L' of the samples 20. For example, the magnetron may be a planar magnetron, which may be understood as a magnetron that may include one or more permanent magnets aligned adjacent to one another with oppositely orientated poles. The ends of the magnets 30a and 30c may be the north pole of the respective magnet and the end of the adjacent magnet 30b may be the south pole or vice versa. The magnets generate north to south or south to north magnetic fields 32, which may be along the length of the sputter target material 11. The magnets may generally produce a magnetic field of 500 Gauss or more, including 1,000 Gauss or more.

The ion current density generated by the magnetron 12 may be relatively uniform along the length of the sputter target material 11. The ion current density generally may be from 0.01 mA/cm$^2$ to 500 mA/cm$^2$, including all values and increments therein, such as 20 mA/cm$^2$. The rate of decay of the sputter target material 11 and the amount of metal atoms deposited onto the surface of the samples 20 may be substantially uniform along the length of (L-L') of the samples 20.

The nanocrystalline MCrAl and/or MCrAlX interlayer coating(s) may be deposited over the bond coat by magnetron sputtering, or by hybrid chemical-physical vapor deposition using a target material and a reactive precursor gas. The target materials may include or consist of one or more transition metals including nickel, iron, cobalt, chromium, hafnium, yttrium, platinum, rhodium and the like, metals such as aluminum, and/or one or more metalloids including silicon.

In some embodiments, the various transition metals may be provided using a first target and aluminum may be provided by a second target. It may be appreciated that additional targets may also be provided, which may depend on the coating composition. In addition, a reactive precursor gas may or may not be necessary to form the MCrAlX coating layers. However, an inert gas may still be provided in the atmosphere of the process chamber. The precursor gas, if used, may comprise nitrogen, carbon, and/or oxygen, as well as metalloids, such as silicon. It may be appreciated that, in addition to single component precursors, such as $N_2$ or $O_2$, the precursor gas may include relatively high molecular weight gases, such as trimethyl silane $(CH_3)_3$—SiH.

By way of example but not limitation, the MCrAl or MCrAlX interlayer coatings may be deposited using plasma enhanced magnetron sputtering, wherein deposition times may range from 100 minutes to 600 minutes, including all values and increments therein. A power of 0.5 to 5 kW may be provided to the targets, including all values and increments therein. It may be appreciated that different power levels or bias may be applied to the individual targets. In one embodiment, approximately one quarter of the power applied to a target including one or more transition metals may be applied to a target including aluminum or one or more metalloids. Accordingly, a target including one or more metalloids may receive power $P_1$ that is 20 to 40 percent of the power received by the target including the one or more transition metals $P_2$, including all values and increments therein, wherein $(0.40*P_2) \geq P_1 \geq (0.20*P_2)$.

The following embodiments are not meant to limit the scope of the claimed subject matter, but rather to illustrate various aspects of the method and resulting coated substrate.

Deposition of a Nanocrystalline MCrAl Coating

A sample of GTD 111, a nickel-based gas turbine blade material, was utilized as a substrate metal alloy material, and a conventional bond coat of NiCoCrAlY was applied by HVOF-spraying. The nominal chemical composition of the GTD 111 substrate alloy is shown in Table 1.

TABLE 1

Nominal chemical composition of the GTD 111 substrate alloy, weight %

| Alloy | C | Cr | Co | Mo | W | Ta | Ti | Al | Zr |
|---|---|---|---|---|---|---|---|---|---|
| GTD 111 | 0.10 | 14. | 9.5 | 1.5 | 3.8 | 2.8 | 4.9 | 3.0 | 0.10 |

A nanocrystalline NiCoCrAlSi interlayer coating was applied on top of the NiCoCrAlY bond coat by the PEMS process, using a dual magnetron system, provided by Southwest Research Institute, San Antonio Tex., as shown in FIG. 4.

The nanocrystalline NiCoCrAlSi coating was obtained using two targets of NiCoCrAlSi (Haynes 160) and Al. The nominal chemical composition of the Haynes 160 target is given in Table 2. The Al target was 99.99% Aluminum.

TABLE 2

Nominal Chemical Composition of Haynes 160[1], weight %

| Ni | Co | Cr | Fe | Si | Mn | Ti | C | W | Mo | Cb |
|---|---|---|---|---|---|---|---|---|---|---|
| 37[a] | 30 | 28 | 3.5* | 2.75 | 0.5 | 0.6 | 0.05 | 1* | 1* | 1* |

[1]Haynes International High Temperature Alloys,
[a]Balance,
*Maximum

The magnetron power of the Haynes 160 and Al targets were maintained at 4 kW and 1.1 kW, respectively. The nanocrystalline Haynes 160+Al (NiCoCrAlSi) coating was deposited on the NiCoCrAlY coated GTD 111 samples.

Characterization of the As-Deposited Samples

Figure 5:
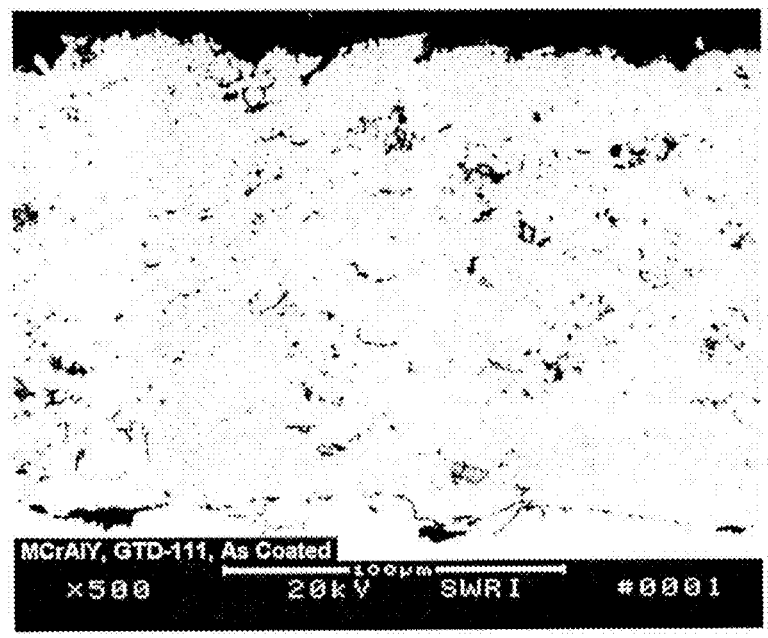
FIG. 5 is a micrograph of a cross section of a conventional HVOF-sprayed NiCoCrAlY coated sample in the as-deposited condition.

The cross section of the conventional HVOF-sprayed NiCoCrAlY (bond) coated sample in the as-deposited condition is shown in FIG. 5. The bond coating exhibited duplex structure containing fine β-phase [(Co and/or Ni) Al)] particles in a γ (Ni rich solid solution) matrix. For chemical composition of the coating, Energy Dispersive Spectroscopic (EDS) analysis was performed on the overall coating and the results are presented in Table 3. All NiCoCrAlY coated samples were polished to a 1.0 μm finish prior to application of the nanocrystalline coating and/or YSZ thermal barrier coating using standard metallographic procedures.

TABLE 3

Chemical composition of the HVOF-sprayed NiCoCrAlY coating, weight %

| HVOF Coating | Ni | Cr | Co | Al | Y |
|---|---|---|---|---|---|
| NiCoCrAlY | 34.39 | 35.86 | 21.39 | 7.61 | 0.75 |

The chemical composition of the magnetron sputter deposited NiCoCrAlSi coating applied on a coupon sample along with cylindrical test samples is given in Table 4. The coating showed a single phase structure, and the thickness of the nanocrystalline coating on the HOVF deposited NiCoCrAlY coated samples was 17 μm. The grain size of the nanocrystalline coating was quantified using the width of the most intense Ni-rich phase peak of the x-ray diffraction pattern and was 4 nm.

TABLE 4

Chemical Composition of the Nanocrystalline NiCoCrAlSi Coating on the HOVF NiCoCrAlY Coated Sample, weight %.

| Coating * | Al | Si | Co | Cr | Ni | Fe | Ti |
|---|---|---|---|---|---|---|---|
| NiCoCrAlSi | 6.25 | 2.45 | 29.50 | 27.88 | 33.16 | 0.29 | 0.47 |

* Coating deposited on the coupon sample along with test samples

Figure 1:
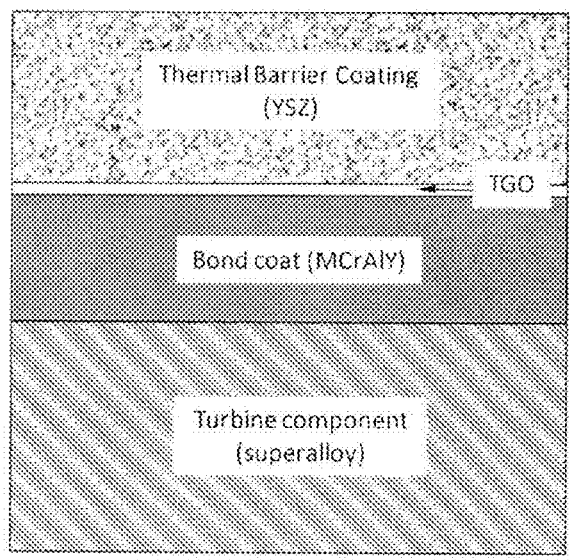
FIG. 1 is a schematic representation of the microstructure of a service-exposed YSZ coated component exhibiting four different layers.
Figure 2:
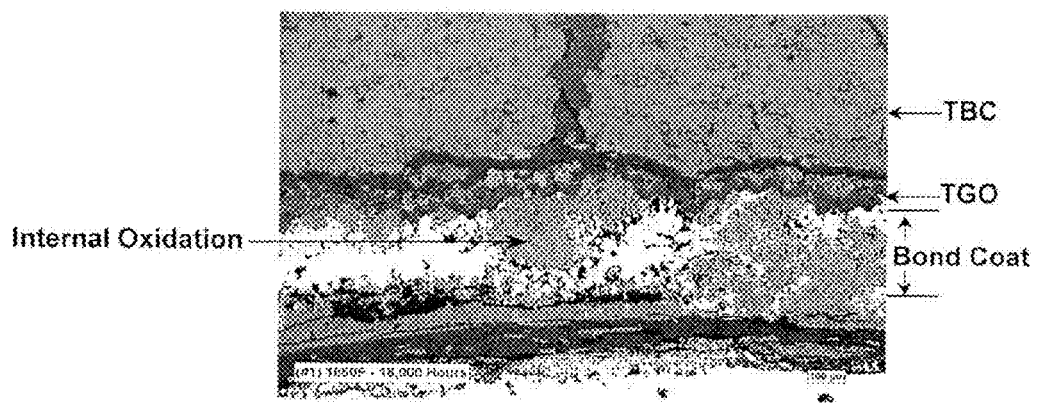
FIG. 2 is a micrograph of a cross section of a YSZ thermal barrier coating coated substrate having a bond coat between the TBC and the substrate, illustrating internal oxidation of the bond coat after 18,000 hours of service at 1850° F.
Figure 6:
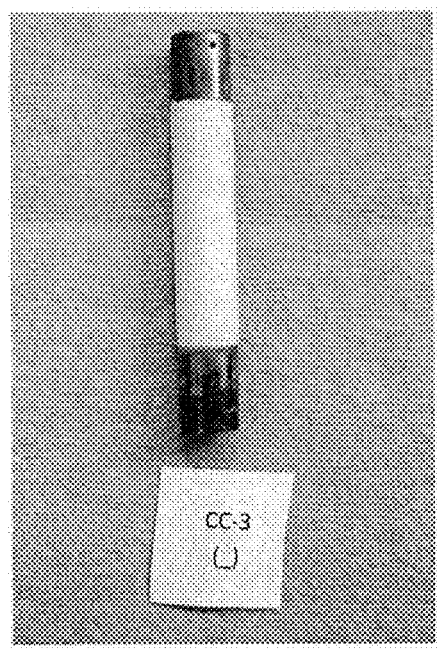
FIG. 6 is a photograph of a YSZ coated test sample.

Standard thermal barrier coating of YSZ was then deposited on top of the magnetron sputtered nanocrystalline NiCoCrAlSi coated samples, as schematically shown in FIG. 3, along with the conventional NiCoCrAlY coated samples, as schematically shown in FIG. 1 using the EB-PVD process. The YSZ coating thickness on the samples was in the range of 240-270 μm. The YSZ coating was not applied about 0.5 inches in length on both ends of the samples, to mitigate initiation of YSZ cracking or spallation from the edges of the end faces. FIG. 6 shows a YSZ coated test sample.

Thermal Cycling Testing of YSZ Coated Samples with and without Nanocrystalline Interlayer Thermal cycling testing was conducted on the YSZ coated samples at a peak temperature of 1850° F. (1010° C.). The specimens were thermal cycled in a programmable, automated, and bottom drop furnace. Two samples having the nanocrystalline NiCoCrAlSi interlayer disposed between the conventional NiCoCrAlY bond coat and the YSZ thermal barrier coating, and two samples without the nanocrystalline interlayer were tested. For thermal cycling exposure, the specimens were inserted into the furnace, which was maintained at the peak temperature and held at that temperature for 50 minutes. The specimens were then removed from the furnace and subjected to forced air cooling for 10 minutes (to room temperature). The samples were then reinserted back into the furnace for another 60-minute cycle. One sample of each, with and without an interlayer coating, was removed after 1003 and 2010 cycles to characterize the effect of the nanocrystalline interlayer on thermally grown oxide (TGO) characteristics and growth kinetics. The top YSZ coating on all samples was free from cracking and spallation after thermal cycling testing.

Figure 7:
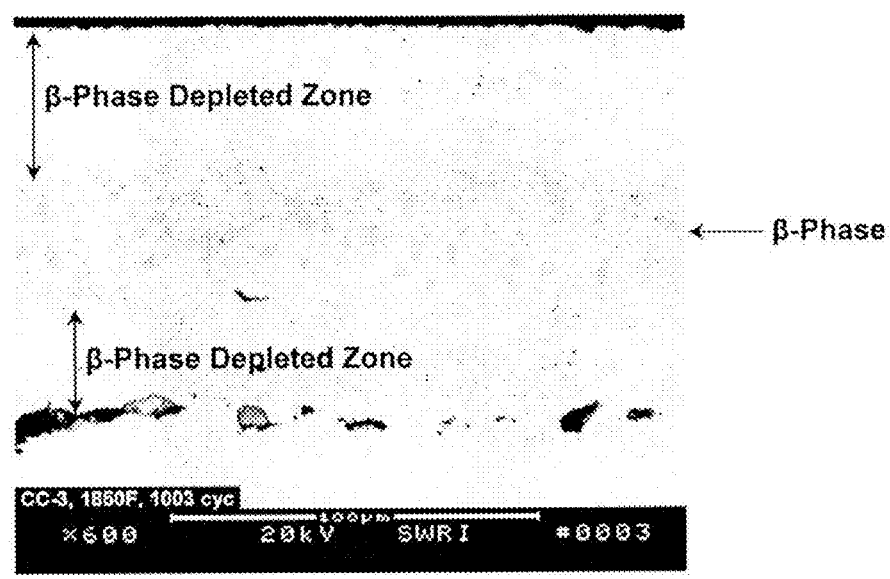
FIG. 7 is a back scattered electron micrograph image of the cross section of the TBC coated specimen showing β-phase (gray) particles in the conventional MCrAlY bond coating and β-phase depleted zones after 1003 cycles exposure at 1850° F. (1010° C.).
Figure 8:
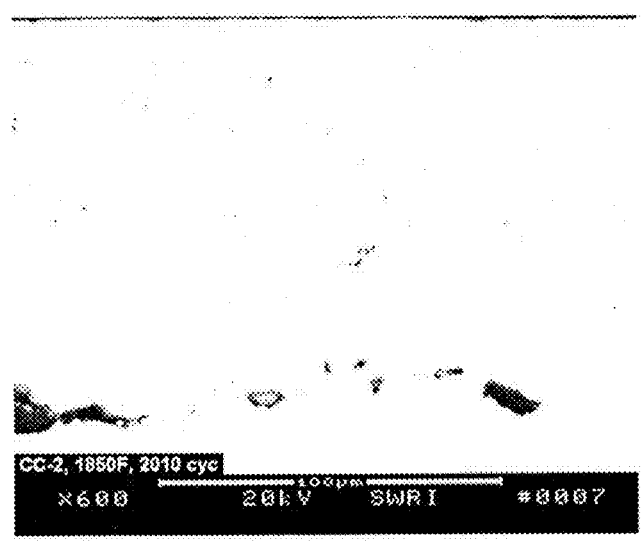
FIG. 8 is a back scattered electron micrograph image of the cross section of the TBC coated specimen showing absence of β-phase particles in the conventional MCrAlY bond coating after 2010 cycles exposure at 1850° F. (1010° C.).

Examination of the cross sections of the TBC coated samples with only the conventional MCrAlY bond coat after 1003 and 2010 cycles thermal exposure at 1850° F. (1010° C.) showed Al-rich β-phase in the HOVF NiCoCrAlY bond coat after 1003 cycles exposure, as shown in FIG. 7. The micrograph also revealed a wide β-phase depleted zone at the inner surface, adjacent to the substrate and the bond coat outer surface. The β-phase in the coating was completely consumed after exposure to 2010 cycles as shown in FIG. 8, which in turn would make the coating more susceptible to internal oxidation. The β-phase in the coating acts as a reservoir for Al. The complete consumption of this phase is typically used for determining coating refurbishment time.

Figure 9:
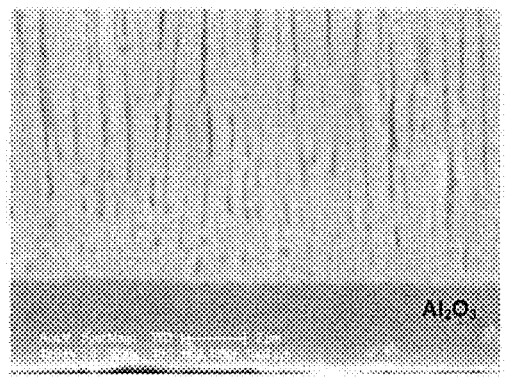
FIG. 9 is an SEM fractograph of the cross section of the TBC coated sample after 1003 cycles exposure at 1850° F. (1010° C.) showing fine second phase Cr-rich oxide particles in the Al-rich TGO matrix.
Figure 10:
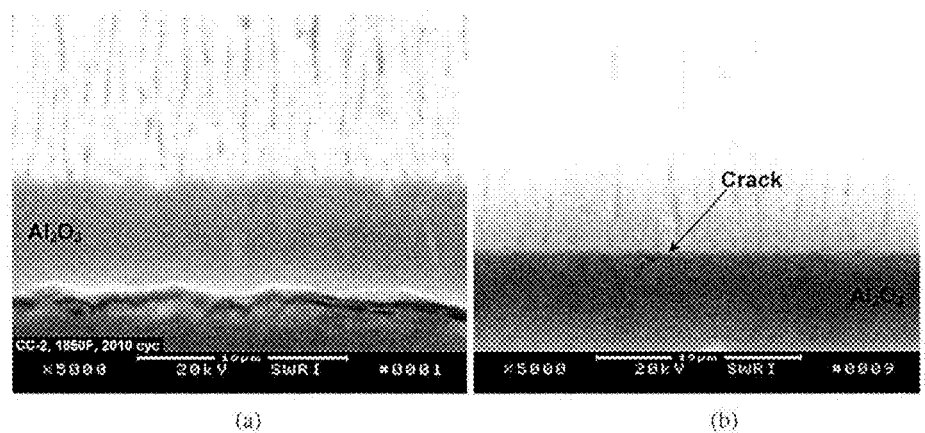
FIG. 10 are SEM fractographs of the cross section of the TBC coated sample after 2010 cycles exposure at 1850° F. (1010° C.) showing (a) fine second phase Cr-rich oxide particles in the Al-rich TGO matrix and (b) a micro crack at the TGO/YSZ interface.

The Al content in the bond coat dropped from 7.6 weight % in the as deposited condition (Table 5) to 4.66 weight % and 3.60 weight % after 1003 and 2010 cycles exposure, respectively. However, the bond coat showed no evidence of internal oxidation or delamination at the coating/substrate interface in both samples. The absence of β-phase and the low content in the coating make it susceptible to internal oxidation and a coating in this condition is normally recommended for refurbishment. Examination of the cross sections of the samples also revealed a continuous thermally grown oxide (TGO) scale below the thermal barrier coating. Mechanical grinding and polishing of the samples caused delamination of the TGO at the TGO/bond coat interface. The TGO in both samples was predominantly $Al_2O_3$. However, Cr-rich oxide particles were seen in isolated areas, as shown in FIGS. 9 and 10. In isolated areas, micro cracks were observed in the TGO at the TGO/YSZ interface of the sample after 2010 cycles of exposure. The propagation of these cracks would lead to YSZ spallation. The average TGO thickness increased from 4.36 to 5.94 um as the thermal cycling exposure increased from 1003 to 2010 cycles.

TABLE 5

Al content in the Nanocrystalline Interlayer and conventional NiCoCrAlY Bond Coatings After Thermal Exposure, wt. %

| | Al After Thermal Exposure | |
|---|---|---|
| Coating | 1003 Cycles | 2010 cycles |
| Bond/Interlayer Coatings | | |
| Overall coatings | 6.22 | 5.30 |
| Nanocrystalline coating | 3.86 | 3.58 |
| Conventional NiCoCrAlY Bond Coat | 6.29 | 6.19 |
| Conventional NiCoCrAlY | 4.66 | 3.60 |

Figure 11:
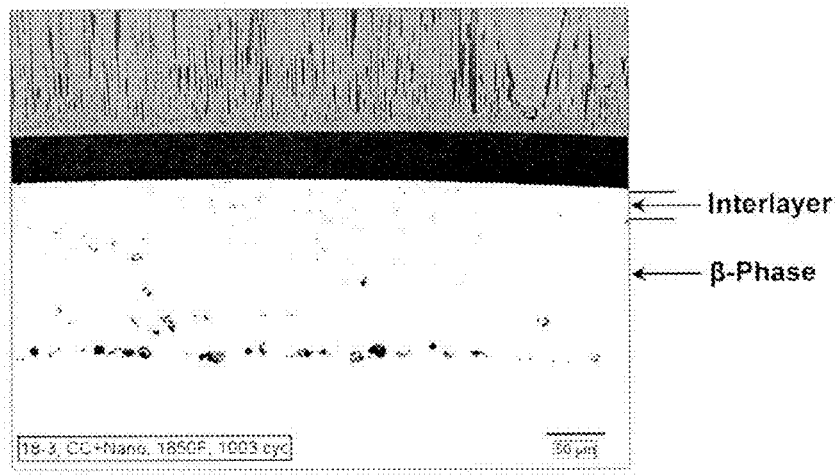
FIG. 11 is an optical micrograph of a cross section of a TBC coated specimen having a nanocrystalline MCrAlX interlayer after exposure to 1850° F. (1010° C.) for 1003 cycles.
Figure 12:
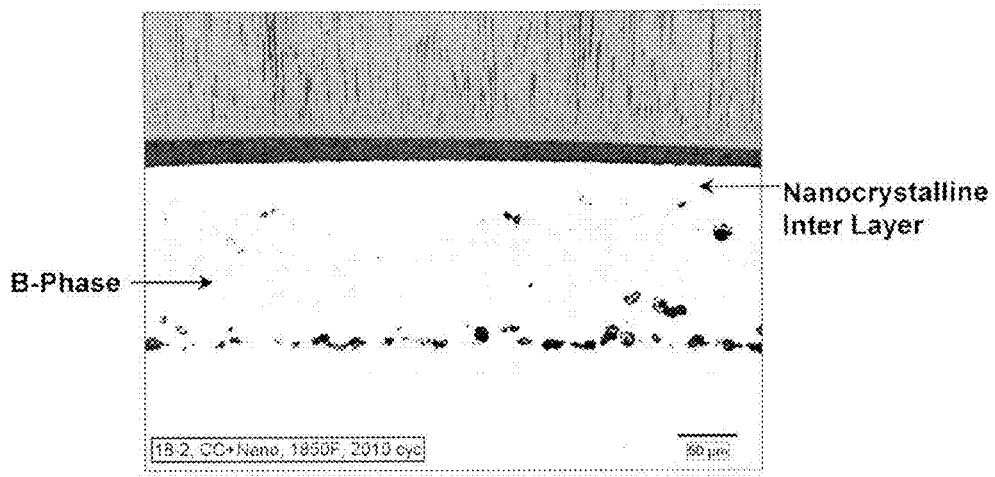
FIG. 12 is an optical micrograph of a cross section of TBC coated specimen having a nanocrystalline MCrAlX interlayer after exposure between 1850° F. (1010° C.) for 2010 cycles.

The cross sections of the TBC coated samples with nanocrystalline interlayer coating after 1003 and 2010 cycles of exposure are shown in FIGS. 11 and 12, respectively. The Al rich β-phase was seen in the conventional NiCoCrAlY bond coat on both samples after thermal exposure. Comparison of these micrographs with those presented in FIGS. 7 and 8 reveals that the presence of the nanocrystalline interlayer slows down the β-phase consumption rate. It is clear from these micrographs that both nanocrystalline and conventional NiCoCrAlY were in good condition and showed no evidence of internal oxidation. The Al content in the bond coatings with and without interlayer coating is compared in Table 5. These results indicate that the presence of the nanocrystalline NiCoCrAlSi interlayer slows down the Al consumption rate at elevated service temperature.

The coating oxidation service life is based on the aluminum (Al) content in the coating and the Al consumption rate. Therefore, the presence of a higher Al content in the coating and a lower consumption rate during service increases the coating service life. The Al and β-phase content results indicates that the presence of interlayer coating improves MCrAlY life, in some embodiments at least by a factor of 2.

Figure 13:
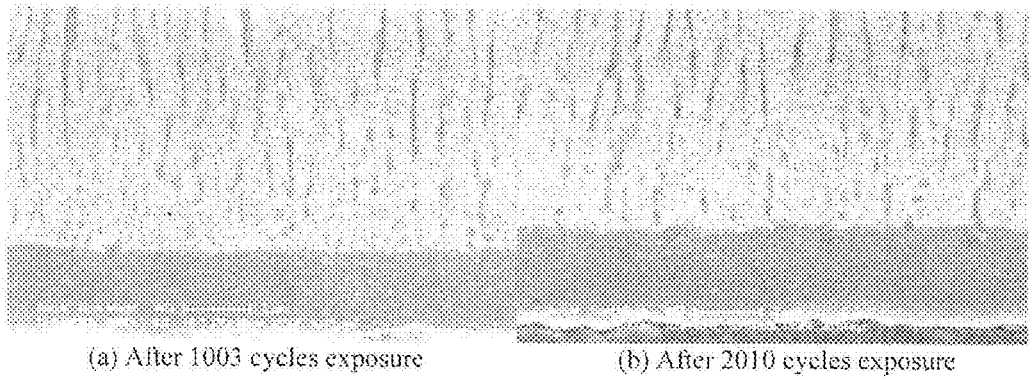
FIG. 13 are SEM micrographs of the cross section of TBC deposited nanocrystalline NiCoCrAlSi and HVOF MCrAlY a) after 1003 and b) after 2010 cycles exposure to 1850° F. (1010° C.) showing dense and continuous TGO scale.

Thus, the presence of nanocrystalline interlayer is beneficial for extending the oxidation service life of the conventional MCrAlY bond coat. FIG. 13 illustrates the presence of a continuous TGO scale between the nanocrystalline interlayer and the thermal barrier coating. Analysis of the TGO scale by EDS showed only Al and oxygen peaks, indicating that the TGO scale on both samples was Al-rich oxide, $Al_2O_3$. The TGO scale was free from cracks and other Cr or Ni-rich oxides. The average TGO thickness increased from 3.16 μm to 3.36 μm as the number of thermal cycles increased from 1003 to 2010 cycles. The average TGO thickness on these samples was significantly lower than the samples without the nanocrystalline interlayer (4.36 μm and 5.94 μm).

Thermally Grown Oxide (TGO) Growth Kinetics

Figure 14:
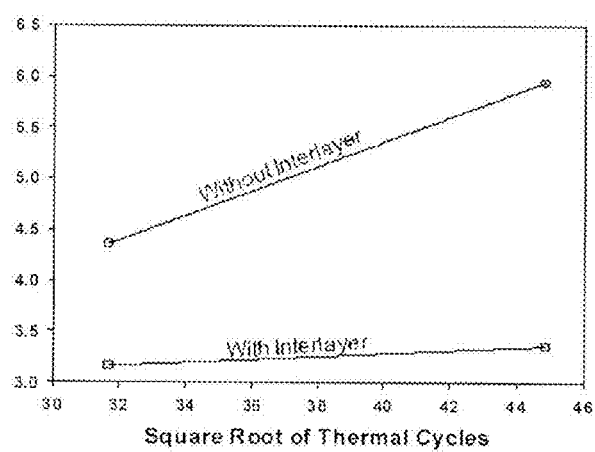
FIG. 14 is a graphical representation of the thermally grown oxide (TGO) Growth Kinetics at the Peak Temperature of 1850° F. (1010° C.) on bond coats with and without a nanocrystalline interlayer coating.

The TGO scale thickness measurements were made on the cross sections of thermal barrier coating coated samples for assessing the influence of nanocrystalline interlayer on the TGO growth rates. The scale thickness measurements were performed at random locations on the samples exposed to 1003 and 2010 cycles, and the results are presented in Table 6. The average TGO scale thickness for the coated samples with and without nanocrystalline interlayer coating is plotted in FIG. 14. It is demonstrated by the plot that the average TGO scale thickness is significantly smaller on the nanocrystalline interlayer/bond coated samples compared to the thickness on the conventional bond coated samples.

The TGO growth rate for the YSZ thermal barrier coating coated samples having a nanocrystalline interlayer coating was significantly lower than that for the bond coat only coated samples. The slower TGO growth rate would significantly increase the service life of the YSZ thermal barrier coating.

TABLE 6

TGO Scale Thickness after Thermal Cycling Exposure at 1850° F. (1010° C.)

| Bond Coat | Cycles | TGO thickness, μm | | | | | | | | |
|---|---|---|---|---|---|---|---|---|---|---|
| | | 2 | 3 | 4 | 5 | 6 | 7 | 8 | 9 | 10 |
| HVOF NiCoCrAlY | 1003 | 4.3 | 4.4 | 4.4 | 4.2 | 4.4 | 4.4 | 4.4 | 4.4 | 4.4 | 4.3 |
| HVOF NiCoCrAlY | 2010 | 6.0 | 6.1 | 6.1 | 6.0 | 5.8 | 6.0 | 5.8 | 5.8 | 6.0 | 5.75 |
| Bond/interlayer coated | 1003 | 2.85 | 2.9 | 2.8 | 2.8 | 2.8 | 2.8 | 2.8 | 2.8 | 3.1 | 3.0 |
| Bond/interlayer coated | 2010 | 3.4 | 3.5 | 3.4 | 3.2 | 3.4 | 3.5 | 3.4 | 3.4 | 3.2 | 3.2 |

Degradation of gas turbine component coatings, such as on turbine blades, can eventually destroy gas turbine blade creep properties. Primary failure mechanisms for thermal barrier coatings (TBCs) include growth of a thermally grown oxide (TGO) and bond coat oxidation. A method to extend coating life could significantly reduce blade failures, extend maintenance intervals, and reduce costs.

Thermal barrier coatings for gas turbine blades are designed to last 48,000 hours. Current experience indicates about 40% of this period is actually realized. Thermal barrier coatings may exhibit breakdown and delamination after 18,000 hours at 1850° F. Extending the maintenance/replacement interval to 40,000 to 48,000 hours could save more than $1 million over the life of a single row of blades.

The nanocrystalline interlayer coating significantly retarded growth of thermally grown oxide. Thermal cycling tests demonstrated no weight change and almost no thermal oxide growth versus a conventional single layer TBC coating. The nanocrystalline interlayer coating can significantly increase service life of coated hot section components.

Although the invention has been described in detail through the above detailed description and the preceding examples, these examples are for the purpose of illustration only and it is understood that variations and modifications can be made by one skilled in the art without departing from the spirit and the scope of the invention. It should be understood that the embodiments described above are not only in the alternative, but can be combined.

We claim:

1. A coated substrate comprising:
   a substrate having a surface;
   a bond coat proximate to the substrate surface, wherein said bond coat comprises NiCoCrAlY and exhibits a duplex structure containing fine β-phase [(Co and/or Ni)Al] particles in a Ni solid solution matrix; and
   at least one interlayer disposed between the bond coat and a yttrium stabilized zirconia (YSZ) thermal barrier layer, wherein the interlayer comprises NiCoCrAlSi and exhibits a grain size of less than 100 nm as measured by x-ray diffraction,
   wherein said bond coat is susceptible to loss of Al at elevated temperature and formation of an aluminum oxide layer as between said bond coat and said yttrium stabilized zirconia thermal barrier layer and said interlayer slows down said loss of Al from said bond coat at elevated temperature.

2. The coated substrate of claim 1, wherein the interlayer comprises NiCoCrAlSiHf, with or without yttrium present in an amount of 0 to 0.5 wt %.

3. The coated substrate of claim 1, wherein the bond coat comprises $Ni_{34.39}Cr_{35.86}Co_{21.39}Al_{7.61}Y_{0.75}$ by weight percent of the bond coat and the interlayer comprises $Ni_{33.16}Co_{29.50}Cr_{27.88}Al_{6.25}Si_{2.45}Ti_{0.47}Fe_{0.29}$ by weight percent of the interlayer.

4. A method for coating a substrate to be exposed to high in service temperatures and/or temperature cycles comprising:
   depositing a bond coat on the substrate surface, wherein said bond coat is deposited by plasma spray or high velocity oxygen fuel (HVOF) thermal spray and wherein said bond coat comprises NiCoCrAlY and exhibits a duplex structure containing fine β-phase [(Co and/or Ni)Al] particles in a Ni solid solution matrix;
   depositing by physical or chemical vapor deposition at least one nanocrystalline interlayer on the bond coat wherein the interlayer comprises NiCoCrAlSi has a grain size of less than 100 nm as measured by x-ray diffraction; and
   depositing a yttrium stabilized zirconia (YSZ) thermal barrier coating on the nanocrystalline interlayer,
   wherein said bond coat is susceptible to loss of Al at elevated temperature and formation of an aluminum oxide layer as between said bond coat and said yttrium stabilized zirconia thermal barrier layer and said interlayer slows down said loss of Al from said bond coat at elevated temperature.

5. The method of claim 4, wherein the nanocrystalline interlayer comprises NiCoCrAlSiHf, with or without yttrium present in an amount of 0 to 0.5 wt %.

6. The method of claim 4, wherein the bond coat comprises $Ni_{34.39}Cr_{35.86}Co_{21.39}Al_{7.61}Y_{0.75}$ by weight percent of the bond coat and the interlayer comprises $Ni_{33.16}Co_{29.50}Cr_{27.88}Al_{6.25}Si_{2.45}Ti_{0.47}Fe_{0.29}$ by weight percent of the interlayer.

* * * * *